(12) United States Patent
Kim et al.

(10) Patent No.: US 7,772,026 B2
(45) Date of Patent: Aug. 10, 2010

(54) MEMS DEVICE PACKAGE AND METHOD FOR MANUFACTURING THE SAME

(75) Inventors: Jong-seok Kim, Hwasung-si (KR);
Yun-kwon Park, Dongducheon-si (KR);
Kuang-woo Nam, Yongin-si (KR);
Seok-chul Yun, Yongin-si (KR); In-sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 585 days.

(21) Appl. No.: 11/270,482

(22) Filed: Nov. 10, 2005

(65) Prior Publication Data

US 2006/0141650 A1   Jun. 29, 2006

(30) Foreign Application Priority Data

Dec. 27, 2004   (KR) .................. 10-2004-0112699

(51) Int. Cl.
*H01L 21/00* (2006.01)
*H01L 21/30* (2006.01)
*H01L 21/461* (2006.01)

(52) U.S. Cl. .................. 438/51; 438/52; 438/112; 438/456; 438/709; 438/725; 257/E21.513; 257/E21.515

(58) Field of Classification Search .............. 438/51, 438/52, 112, 123, 456, 459, 709, 725; 257/E21.513, 257/E21.515
See application file for complete search history.

(56) References Cited

U.S. PATENT DOCUMENTS 5,683,548 A * 11/1997 Hartig et al. ............ 438/729
6,228,675 B1 * 5/2001 Ruby et al. ............ 438/106
6,429,511 B2 * 8/2002 Ruby et al. ............ 257/704
6,479,320 B1 * 11/2002 Gooch ............ 438/109
6,777,263 B1 * 8/2004 Gan et al. ............ 438/106
7,050,320 B1 * 5/2006 Lai et al. ............ 365/63
7,123,119 B2 * 10/2006 Pashby et al. ............ 333/262
7,202,560 B2 * 4/2007 Dungan et al. ............ 257/713
2004/0259325 A1 * 12/2004 Gan ............ 438/456
2005/0167795 A1 * 8/2005 Higashi ............ 257/678

* cited by examiner

*Primary Examiner*—Walter L. Lindsay, Jr.
*Assistant Examiner*—Ron Pompey
(74) *Attorney, Agent, or Firm*—Sughrue Mion, PLLC

(57) ABSTRACT

A micro electro-mechanical system (MEMS) device package and a method of manufacturing the same are provided. The inventive MEMS device package includes: a device substrate with a MEMS active device being formed on the top surface thereof; internal electrode pads, each of which is positioned on the opposite side of the MEMS active device to provide a space where the MEMS active device is positioned and an electrical path for the MEMS active device, each of the internal electrode pads, and comprises first and second pads arranged opposite to one another with a clearance therebetween; sealing pads positioned outside of the internal electrode pads; a closure substrate joined to the device substrate through the sealing pads, the closure substrate having via holes formed at the areas where the internal electrode pads are positioned; connection members each formed on the inner surfaces of the via holes to be in contact with the internal electrode pads at one ends thereof; and external electrode pads formed on the top surface of the closure substrate in such a way that the external electrode pads are in contact with the other ends of the connection members.

11 Claims, 4 Drawing Sheets

…

MEMS DEVICE PACKAGE AND METHOD FOR MANUFACTURING THE SAME

CROSS-REFERENCE TO RELATED APPLICATIONS

This application claims under 35 U.S.C. §119 (a) priority from Korean Patent Application No. 2004-112699 filed on Dec. 27, 2004 in the Korean Intellectual Property Office, the disclosure of which is incorporated herein by reference.

BACKGROUND OF THE INVENTION

1. Field of the Invention

Apparatuses and methods consistent with the present invention relate to a micro electro-mechanical system (MEMS) device package and a method for manufacturing the same.

2. Description of the Related Art

MEMS is the integration of sensors, micro actuators, gyroscopes, precise machine parts, etc. using semiconductor processing technology. As a high level of precision, product uniformity, and superior productivity required for semiconductor processing are applied to MEMS, MEMS is recognized as a technology capable of improving performances of products while reducing costs.

MEMS devices such as acceleration sensors, angular velocity sensors, resonant gyroscopes, or the like are packaged for the purpose of enhancing protectability and/or sensitivity thereof. As high density and miniaturization of MEMS devices have been realized due to the rapid development of technologies for manufacturing MEMS devices, it is also required for packages to be correspondingly miniaturized. For this purpose, Wafer Scale Package (WSP) application for packaging devices in a wafer state is frequently attempted.

FIG. 1 is a cross-sectional view schematically showing an example of a conventional MEMS device package. As shown in the figure, a device substrate 1 is provided with a MEMS active device 2, and a glass closure substrate 3 is joined to the device substrate 1 for protecting the MEMS active device 2. The MEMS active device 2 typically has a spring structure and a stage supported by the spring structure.

In addition, internal electrode pads 5 are formed on the device substrate 1, wherein each of the internal electrode pads is positioned on the opposite side of the MEMS active device 2 and electrically connected to the MEMS active device 2. A cavity 4 is formed under the glass closure substrate 3 for providing a space for receiving the MEMS active device 2, wherein the glass closure substrate 3 and the device substrate 1 are anodic-bonded to each other.

In addition, via holes 6 are formed on the opposite sides of the glass closure substrate 3, and external electrode pads 7, which are connected to the internal electrode pads 5, are formed through the via holes 6. Here, the via holes 6 are formed through a sandblasting process, and the external electrodes 7 are formed by filling a metallic material (typically Al) in the via holes 6 through a sputtering process. The external electrode pads 7 are connected to a signal line on a circuit board not shown in the figure through a wire, a bump or the like.

However, a conventional MEMS device package as described above inevitably has a thick glass closure substrate 3 due to the bonding structure between the glass closure substrate 3 and a silicon-based device substrate 1 and the manufacturing process of the MEMS device package, whereby there is a limit in reducing the size of the package due to the via holes 6 in the glass substrate 3. In other words, due to a large size and a high height, such a conventional MEMS package occupies a large volume in an apparatus incorporating it, thereby causing the miniaturization of the apparatus to be hindered.

Furthermore, because such a conventional MEMS package employs a closure substrate 3 formed from glass, it is necessary to use a sandblasting process which is troublesome, and because the depth of the via holes 6 are deep, a deposition process for forming the external electrode pads 7 requires much time, thereby causing a decrease in yield and productivity.

Such a conventional MEMS package also has a problem in that the MEMS active device 2 may be deformed or damaged due to high temperature (typically about 460° C.) at the time of anodic-bonding and has basic stress due to the difference in thermal expansion coefficient between the glass closure substrate 3 and the silicon-based device substrate 1.

Moreover, a problem of reliability may be presented because the connection of a circuit by means of the internal electrode pads 5 formed from a silicon material and the external electrode pads 7 formed from a metallic material produces a very high inductance in relation to RF signals of high frequency and electrical contact resistance at the contact parts, thereby causing a high loss in signal.

SUMMARY OF THE INVENTION

Accordingly, an illustrative, non-limiting embodiment of the present invention has been made to solve the above-mentioned problems, and an aspect of the present invention is to provide a MEMS device package, in which a closure substrate which is formed from a material identical to that of a device substrate is employed so as to reduce the stress caused by a difference in thermal expansion coefficient, of which the manufacturing process is simple, and which can be minimized in size, and a method of manufacturing such a MEMS device package.

Another aspect of the present invention is to provide a MEMS device package, in which a device substrate and a closure substrate are bonded to each other with direct bonding, such as Au—Au direct bonding, which uses a material identical to the material forming the internal electrode pads and the sealing pads of the MEMS device package, so that the package is stable and capable of enhancing an yield, and a method of manufacturing such a MEMS device package.

A still further aspect of the present invention is to provide a MEMS device package, in which a circuit connection structure is formed by contacting members formed from a same or highly conductive material so as to minimize a loss in signal, and a method of making such a MEMS device package.

In order to achieve the above-mentioned aspects, there is provided a MEMS device package which includes: a device substrate with a MEMS active device being formed on the top surface thereof; internal electrode pads, each of which is positioned on the opposite side of the MEMS active device to provide a space where the MEMS active device is positioned and an electrical path for the MEMS active device, and comprises first and second pads arranged opposite to one another with a clearance therebetween; sealing pads each positioned outside of the internal electrode pads; a closure substrate joined to the device substrate through the sealing pads, the closure substrate having via holes formed at the areas where the internal electrode pads are positioned; connection members, each of which is formed on the inner surfaces of the via holes to be in contact with the internal electrode pads at one ends thereof; and external electrode pads formed on the top surface of the closure substrate in such a way that the external electrode pads are in contact with the other ends of the connection members.

The internal electrode pads, the sealing pads, the connection members and the external electrode pads may be all formed from an identical material such as Au and the device substrate and the closure substrate may be bonded to each other with direct bonding such as Au—Au direct bonding.

According to another aspect of the present invention, there is provided a method of manufacturing a MEMS device package which may include following steps: a) forming several via holes having a predetermined depth on a closure substrate; b) forming a seed layer on the entire surface of the closure substrate formed with the via holes; c) forming internal electrode pads and sealing pads on the seed layer; d) bonding the closure substrate, which is formed with the internal electrode pads and the sealing pads, and a device substrate, which is formed with the active MEMS active device on the center of the top surface thereof, to each other through the sealing pads; e) polishing the closure substrate to a predetermined thickness, so that the via holes and the seed layer parts formed in the via holes are exposed; and f) forming, on the closure substrate, external electrode pads which are electrically connected with the seed layer parts formed in the via holes.

The step a) of the above method may include sub-steps of: a1) coating and patterning a photoresist layer on the top surface of the closure substrate; and a2) performing Inductively Coupled Plasma (ICP)-etching and removing the photoresist layer.

In the step b) of the above method, to form a seed layer on the entire surface of the closure substrate, a material identical to the material which forms the internal electrode pads and the sealing pads may be sputtered.

The step c) of the above method may include following sub-steps: c1) forming a plating frame having parts to form internal electrode pads and sealing pads on the seed layer through a photolithography process; c2) electrically plating a material such as Au to form internal electrode pads and sealing pads over the plating frame; and c3) removing the plating frame and the seed layer underside of the plating frame.

In the step d) of the above method, bonding of the device substrate and the closure substrate to each other through the sealing pads may employ direct bonding which uses a material identical to the material forming the internal electrode pads and the sealing pads. For such direct bonding, Au—Au direct bonding may be performed at a temperature of 320±10° C. for about 20 minutes.

In the step f) of the above method, to form external electrode pads on the closure substrate, a material, such as Au, identical to the material which forms the internal electrode pads and the sealing pads may be sputtered.

BRIEF DESCRIPTION OF THE DRAWINGS

The above aspects and features of the present invention will be more apparent from the description for exemplary embodiments of the present invention taken with reference to the accompanying drawings, in which.

DETAILED DESCRIPTION OF THE EXEMPLARY EMBODIMENTS

Hereinbelow, an exemplary embodiment of the present invention is described in detail with reference to accompanying drawings.

Figure 1:
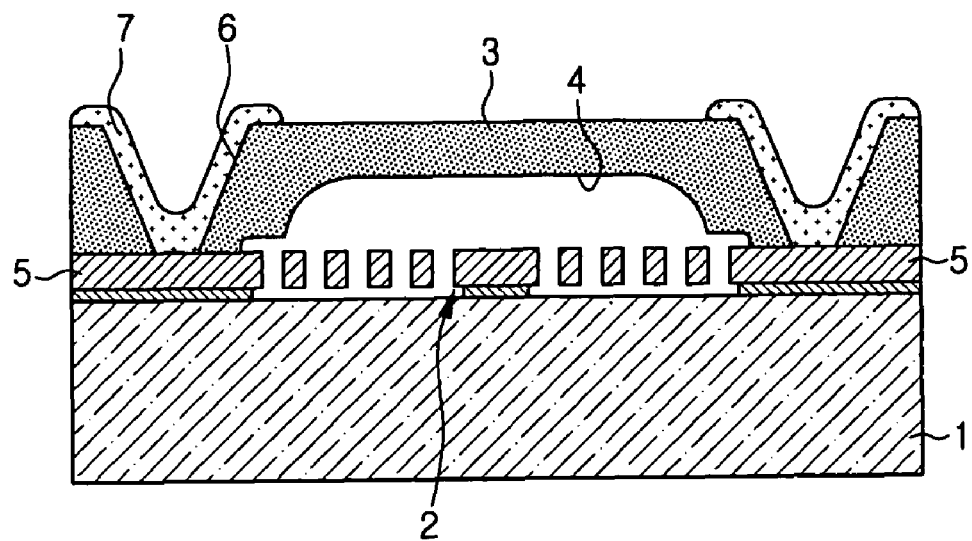
FIG. 1 is a schematic structural view of a conventional MEMS device package.
Figure 2:
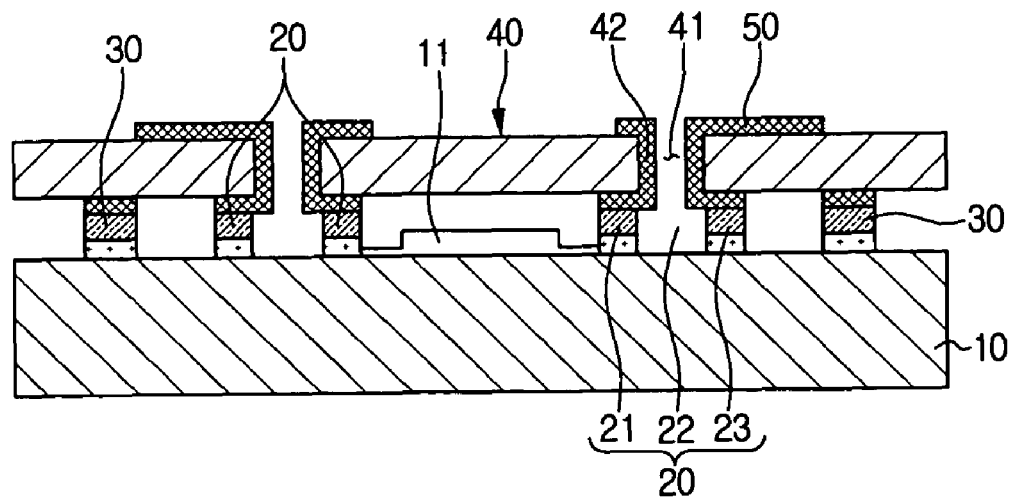
FIG. 2 is a schematic structural view of a MEMS device package according to an exemplary embodiment of the present invention.

FIG. 2 is a schematic structural view of a MEMS device package according to an exemplary embodiment of the present invention. As shown in the figure, a MEMS active device 11 is formed on the central part of the top surface of a device substrate 10. The MEMS active device 11 typically comprises a spring element, a stage supported by the spring element, and electrodes for detecting the displacement of the stage or supplying a driving force for the stage. Such a MEMS active device 11 does not limit the technical scope of the present invention.

In addition, internal electrode pads 20 are placed on the device substrate 10 wherein each of the internal electrode pads 20 is positioned on the opposite side of the MEMS active device 11 in order to provide a space for positioning the MEMS active device 11 as well as to provide an electric path for the MEMS active device 11. Each of the internal electrode pads 20 comprises first and second pads 21, 23 opposite to each other with a clearance 22 between them. The internal pads 20 are formed from Au.

At the outside of the internal electrode pads 20, there are provided sealing pads 30 formed from Au like the internal electrode pads 20 to a height equal to that of the internal electrode pads 20.

A closure substrate 40 is joined to the device substrate 10 via the sealing pads 30. At the top and bottom surfaces of the internal electrode pads 20 and the sealing pads 30, i.e., the interfaces thereof with the device substrates 10 and the closure substrate 40, there are interposed Au layers formed from a seed metal layer to be described later.

Therefore, because the device substrate 10 and the closure substrate 40 are bonded to each other with Au—Au direct bonding, it is possible to bond them within a shorter length of time and at a lower temperature as compared to the anodic bonding of a glass substrate and a silicon substrate in the prior art. The above-mentioned temperature is about 320° C. and the above-mentioned bonding time is about 20 minutes. This means that it is possible to reduce the deformation and damage of a device as compared to the prior art. In addition, the present invention can avoid the stress problem caused by the difference in thermal expansion coefficient in the prior art because the device substrate 10 and the closure substrate 40 are formed from an identical material.

Furthermore, via holes 41 are formed at the areas where the clearances of the internal electrode pads 20 are formed, wherein connection members 42 are formed on the inner circumference surfaces of the via holes 41, one ends of which members are in contact with the first and second pads 21, 23 of the internal electrode pads 20.

External electrode pads 50 are formed on the top surface of the closure substrate 40 to be in contact with the other ends of the connection members 42. The external electrode pads 50 may be simply formed by sputtering Au, for example.

In this manner, the inventive MEMS device package can be thinned and miniaturized by employing a closure substrate 40 formed from a material identical to that of the device substrate 10 and can reduce the loss in signal because it has an electric signal path, of which the internal resistance is retained at a lower level. Furthermore, because the external electrode pads 50 are formed on the surface of the closure substrate 40, the inventive MEMS device package can be mounted on a circuit board in a direct bonding fashion and plural packages can be easily stacked.

Now, a method of manufacturing the inventive MEMS device package is described in detail with reference to FIGS. 3A through 3I. Because conventional processes such as laminating, patterning, etc. are employed in the inventive method, the processing processes are not specifically described.

Figure 3A:
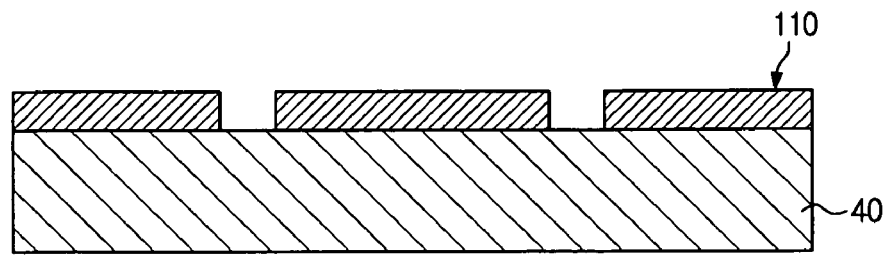
FIGS. 3A to 3I show a process of manufacturing the MEMS device according to an exemplary embodiment of the present invention.
Figure 3B:
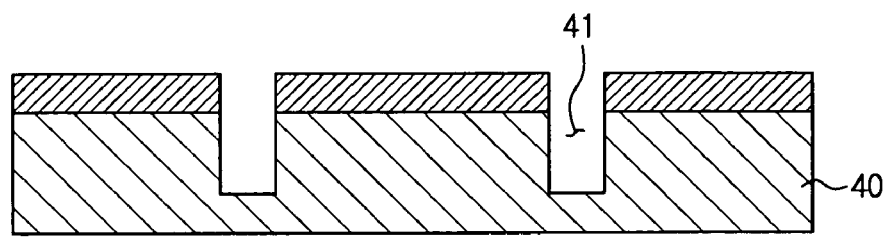

At first, as shown in FIG. 3A, a photoresist pattern 110 for forming via holes is formed on the entire surface of a closure substrate. Then, as shown in FIG. 3B, by ICP-etching, the photoresist pattern with a mask, via holes 41 having a predetermined depth are formed at corresponding positions on the closure substrate 40.

Figure 3C:
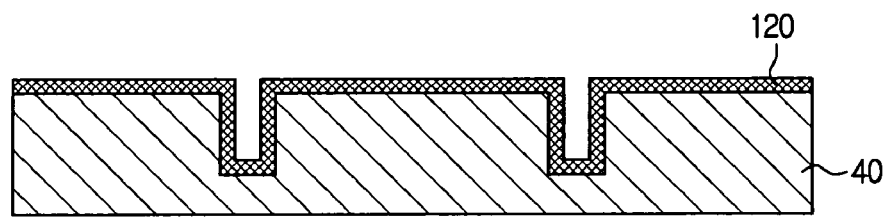

The, as shown in FIG. 3C, Au is sputtered on the entire surface of the closure substrate 40 formed with the via holes to form a seed metal layer 120 having a predetermined thickness. This seed metal layer will form connection members 42 for connecting internal electrode pads 20 and external electrode pads 50 to be described later.

Figure 3D:
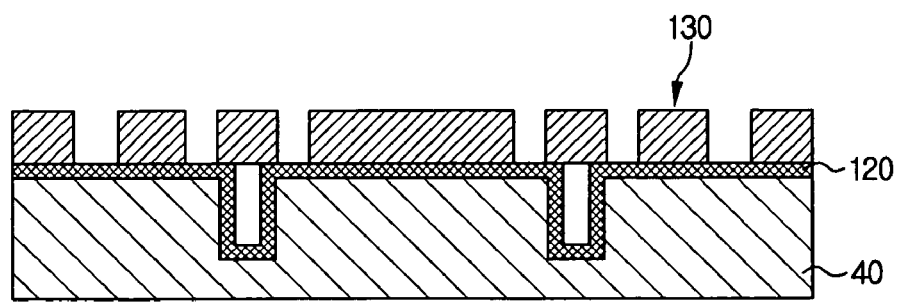

Then, as shown in FIG. 3D, a plating frame 130 is formed on the seed metal layer 120 through a photolithographic process or the like. The plating frame 130 is used for forming internal electrode pads 20 and sealing pads 30.

Figure 3E:
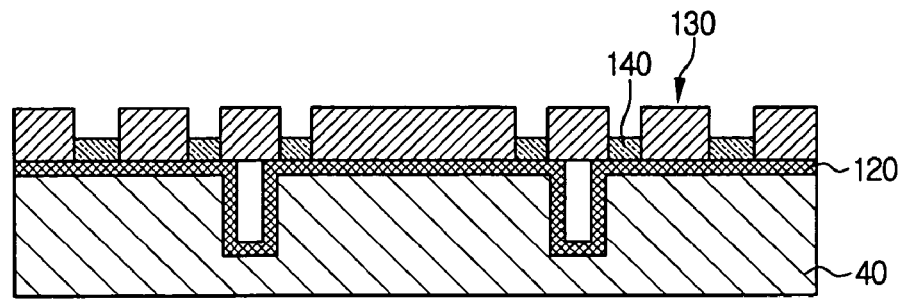

Then, as shown in FIG. 3E, Au 140 is electrically plated through the plating frame 130, then the plating frame 130 is removed, and then the seed metal layer exposed thereby is removed.

Figure 3F:
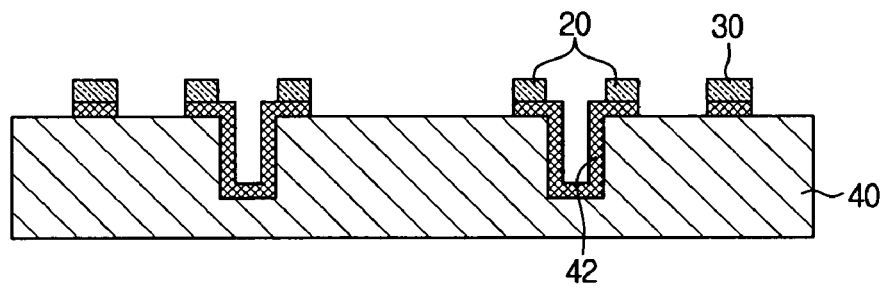

Through this process, as shown in FIG. 3F, a structure with the internal electrode pads 20 and the sealing pads 30 formed on the inner side of the closure substrate 40 is prepared. In the figure, reference numeral 42 indicates connection members formed by partially etching the seed metal layer 120.

Figure 3G:
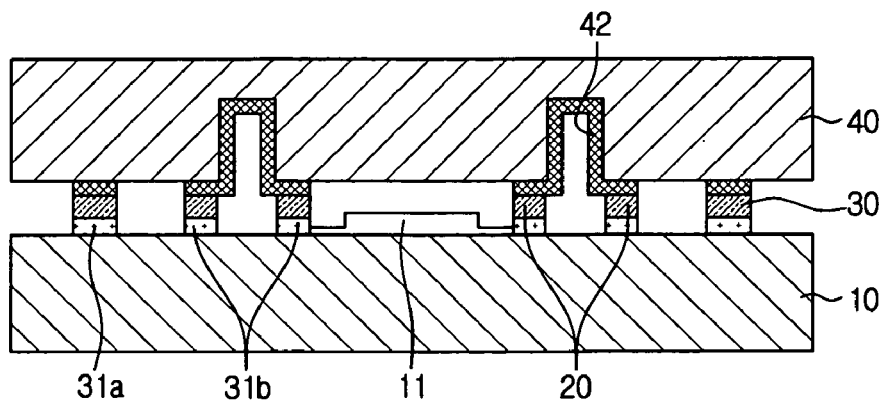
Figure 3H:
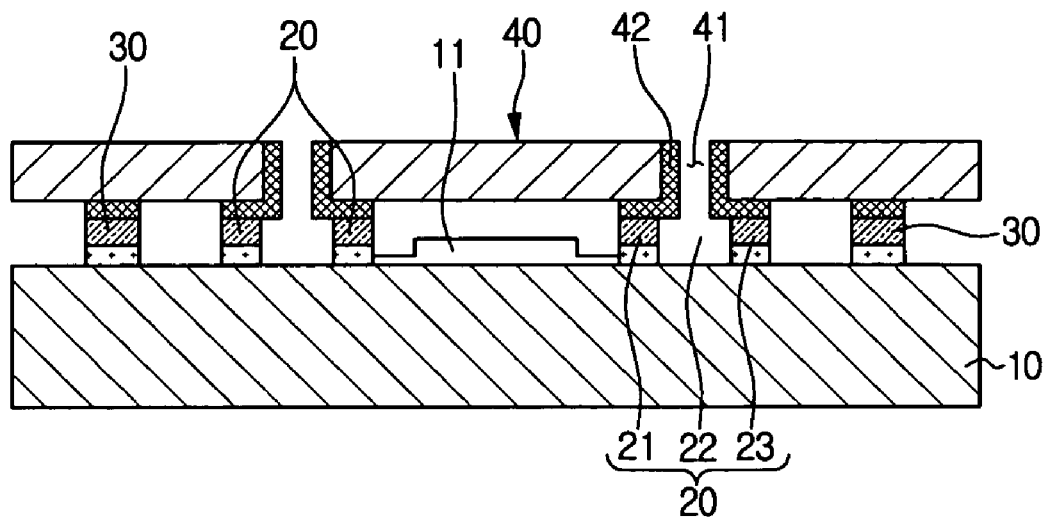

Thereafter, as shown in FIG. 3G, a device substrate 10 having a previously prepared active device 11 is bonded to the closure substrate 40 using the sealing pads 30. At this time, the MEMS active device 11 is positioned within a space formed by the internal electrodes 20, and the internal electrode pads 20 and the sealing pads 30 are respectively in contact with Au layers 31a, 31b formed on the device substrate 10. In other words, because the above-mentioned bonding between the device substrate 10 and the closure substrate 40 is Au—Au direct bonding, it is possible to lower the bonding temperature and to reduce the length of bonding time as compared to the conventional anodic bonding. The bonding temperature is about 320° C. and the bonding time may be around 20 minutes. Therefore, the possibility of deforming or damaging the device at the time of bonding can be reduced as compared to the prior art.

In addition, because the substrates of a same material and hence a same thermal expansion coefficient are bonded to each other unlike the conventional glass substrate to silicon substrate bonding, it is possible to avoid the occurrence of stress caused due to the difference in thermal expansion coefficient, thereby providing a more stable MEMS device package.

After the device substrate 10 and the closure substrate 40 have been bonded to each other as described above, as shown in FIG. 3H, the closure substrate 40 is polished to a predetermined thickness, in such a way that the via holes 41 and the connection members 42 constructed by the seed metal layer parts formed in the via holes 41 are exposed. Here, the predetermined thickness may be about 40 μm. The polishing is performed according to a conventional process which is implemented by grinding, lapping, and chemical mechanical polishing in this sequence.

Figure 3I:
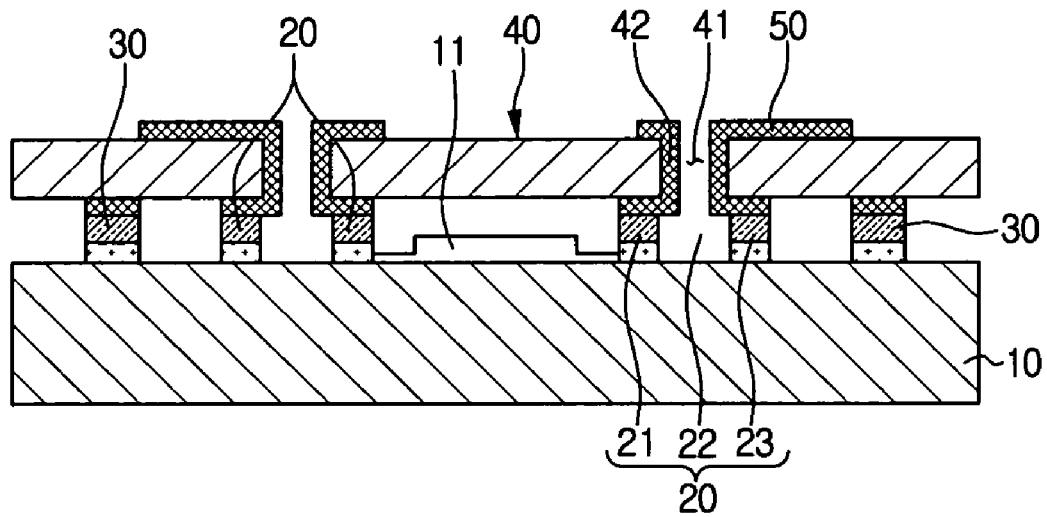

Then, as shown in FIG. 3I, external electrode pads 50 are formed on the top of the closure substrate 40 to be in contact with the other ends of the connection members 42 formed in the via holes 41 in the state of being contacted with the internal electrodes 20. Such a process is performed by coating Au on the closure substrate using a sputtering process or the like.

Therefore, because the electrical signal path for the MEMS active device 11 is formed from a single material, Au, it is possible to solve the problems of high contact resistance and inductance caused in the prior art as the electrical signal path is formed form different materials.

As described above, because it is possible to provide a light, thin and miniaturized package according to the present invention, an apparatus, to which this package is applied, can be also miniaturized.

In addition, because it is possible to provide a package stable and highly reliable in function, the improvement in reliability and quality of an apparatus which employs the package can be realized.

Moreover, because a package can be manufactured with a stable and simple process, it is possible to improve a yield and to save costs.

Although an exemplary embodiment of the present invention has been shown and described in order to exemplify the principle of the present invention, the present invention is not limited to the specific exemplary embodiment. It will be understood that various modifications and changes can be made by one skilled in the art without departing from the spirit and scope of the invention as defined by the appended claims. For example, the present invention can be applied to a package for a highly integrated device beyond a MEMS device. Therefore, it shall be considered that such modifications, changes and equivalents thereof are all included within the scope of the present invention.

What is claimed is:

1. A method of manufacturing a micro electro-mechanical system (MEMS) device package, the method comprising:
   a) forming several via holes having a predetermined depth on a closure substrate;
   b) forming a seed layer on the entire surface of the closure substrate formed with the via holes, the seed layer being formed in a predetermined thickness on inner walls of the via holes without completely filling in the via holes;
   c) forming internal electrode pads and sealing pads on the seed layer;
   d) bonding the closure substrate, which is formed with the internal electrode pads and the sealing pads, and a device substrate, which is formed with a MEMS active device on the center of the top surface thereof, to each other through the internal electrode pads and the sealing pads;
   e) polishing the closure substrate to a predetermined thickness, so that the via holes and the seed layer parts formed in the predetermined thickness in the via holes are exposed; and
   f) forming, on the closure substrate, external electrode pads which are electrically connected with the seed layer parts formed in the via holes,
   wherein the bonding the closure substrate and the device substrate to each other through the internal electrode pads and the sealing pads comprises direct bonding using a bonding layer formed on the device substrate, and
   wherein the bonding layer openings formed to correspond to clearances of the inner electrode pads formed corresponding to the via holes, so that an upper surface of the device substrate corresponding to the openings is exposed to an exterior.

2. The method of claim 1, wherein the step a) comprises:
   a1) coating and patterning a photoresist layer on the top surface of the closure substrate; and
   a2) performing Inductively Coupled Plasma (ICP)-etching and removing the photoresist layer.

3. The method of claim 1, wherein, the forming of a seed layer on the entire surface of the closure substrate comprises sputtering a material which is identical to the material forming the internal electrode pads and the sealing pads.

4. The method of claim 3, the material sputtered to form a seed layer is Au.

5. The method of claim 1, wherein the forming of internal electrode pads and sealing pads on the seed layer comprises:
   c1) forming a plating frame having parts to form internal electrode pads and sealing pads on the seed layer through a photolithography process;
   c2) electrically plating a material to form internal electrode pads and sealing pads over the plating frame; and
   c3) removing the plating frame and the seed layer underside of the plating frame.

6. The method of claim 5, wherein the material electrically plated to form internal electrode pads and sealing pads is Au.

7. The method of claim 1, wherein bonding of the device substrate and the closure substrate to each other through the sealing pads employs direct bonding using a material identical to the material which forms the internal electrode pads and the sealing pads.

8. The method of claim 7, wherein the identical material is Au.

9. The method of claim 8, wherein the direct bonding using Au is performed at a temperature of 320±10° C. for about 20 minutes.

10. The method of claim 1, wherein the forming of external electrode pads on the closure substrate comprises sputtering a material identical to the material which forms the internal electrode pads and the sealing pads.

11. The method of claim 10, wherein the material sputtered to form external electrode pads is Au.

* * * * *